United States Patent
Shimamoto et al.

(10) Patent No.: US 12,341,446 B2
(45) Date of Patent: Jun. 24, 2025

(54) POWER CONVERSION DEVICE, ESTIMATION DEVICE, AND ESTIMATION METHOD

(71) Applicant: KABUSHIKI KAISHA YASKAWA DENKI, Kitakyushu (JP)

(72) Inventors: Keita Shimamoto, Kitakyushu (JP); Shinya Morimoto, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 140 days.

(21) Appl. No.: 18/481,267

(22) Filed: Oct. 5, 2023

(65) Prior Publication Data

US 2024/0030850 A1 Jan. 25, 2024

Related U.S. Application Data

(63) Continuation of application No. PCT/JP2021/015056, filed on Apr. 9, 2021.

(51) Int. Cl.
| | |
|---|---|
| *H02P 21/16* | (2016.01) |
| *G01R 27/26* | (2006.01) |
| *H02P 21/14* | (2016.01) |
| *H02P 23/14* | (2006.01) |

(52) U.S. Cl.
CPC .......... *H02P 21/14* (2013.01); *G01R 27/2611* (2013.01)

(58) Field of Classification Search
CPC .......... H02P 21/16; H02P 21/14; H02P 6/183; H02P 23/14; H02P 21/18; G01R 27/2611
USPC .................................................. 318/400.02
See application file for complete search history.

(56) References Cited

U.S. PATENT DOCUMENTS

| | | | |
|---|---|---|---|
| 10,720,868 B2 * | 7/2020 | Tanaka | H02P 21/16 |
| 11,088,643 B1 * | 8/2021 | Han | H02P 21/141 |
| 2013/0278195 A1 * | 10/2013 | Kobayashi | H02P 6/16 |
| | | | 318/400.38 |
| 2014/0145660 A1 | 5/2014 | Shimada et al. | |
| 2018/0076748 A1 * | 3/2018 | Yamasaki | H02P 21/18 |

(Continued)

FOREIGN PATENT DOCUMENTS

| | | |
|---|---|---|
| JP | 2013-90552 A | 5/2013 |
| JP | 2016-149822 A | 8/2016 |

(Continued)

OTHER PUBLICATIONS

International Search Report issued Jun. 15, 2021 in PCT/JP2021/015056 filed Apr. 9, 2021, 4 pages.

*Primary Examiner* — Gabriel Agared

(74) *Attorney, Agent, or Firm* — Oblon, McClelland, Maier & Neustadt, L.L.P.

(57) ABSTRACT

A power conversion device includes a power conversion circuit that converts primary-side power to secondary-side power and supplies the secondary-side power to an electric motor, and circuitry including a voltage command generator that generates a voltage command in a rotating coordinate system that rotates in synchronization with a magnetic pole position of the electric motor, based on a current command in the rotating coordinate system and a mutual inductance between a first coordinate axis and a second coordinate axis of the rotating coordinate system, and a controller that controls the power conversion circuit to apply a secondary-side voltage corresponding to the voltage command to the electric motor.

20 Claims, 5 Drawing Sheets

(56) References Cited

U.S. PATENT DOCUMENTS

| | | | |
|---|---|---|---|
| 2018/0109218 A1* | 4/2018 | Huh | H02P 21/18 |
| 2018/0109219 A1* | 4/2018 | Huh | H02P 21/18 |
| 2019/0044467 A1 | 2/2019 | Shimamoto et al. | |
| 2021/0364573 A1* | 11/2021 | Kim | H02P 21/141 |

FOREIGN PATENT DOCUMENTS

| | | |
|---|---|---|
| JP | 2019-33582 A | 2/2019 |
| KR | 10-2016-0032894 A | 3/2016 |

\* cited by examiner

POWER CONVERSION DEVICE, ESTIMATION DEVICE, AND ESTIMATION METHOD

CROSS-REFERENCE TO RELATED APPLICATIONS

The present application is a continuation of and claims the benefit of priority to International Application No. PCT/JP2021/015056, filed Apr. 9, 2021, the entire contents of which are incorporated herein by reference.

BACKGROUND OF THE INVENTION

Field of the Invention

The present invention relates to a power conversion device, an estimation device, and an estimation method.

Description of Background Art

Japanese Patent Application Laid-Open Publication No. 2013-90552 describes a rotating electrical machine control device that applies a high-frequency current to a rotating electrical machine with a rotor having saliency, estimates a magnetic pole direction of the rotor based on a high-frequency component included in a voltage command as a response component to the high-frequency current, and performs so-called sensorless vector control for controlling the rotating electrical machine. The entire contents of this publication are incorporated herein by reference.

SUMMARY OF THE INVENTION

According to one aspect of the present invention, a power conversion device includes a power conversion circuit that converts primary-side power to secondary-side power and supplies the secondary-side power to an electric motor, and circuitry including a voltage command generator that generates a voltage command in a rotating coordinate system that rotates in synchronization with a magnetic pole position of the electric motor, based on a current command in the rotating coordinate system and a mutual inductance between a first coordinate axis and a second coordinate axis of the rotating coordinate system, and a controller that controls the power conversion circuit to apply a secondary-side voltage corresponding to the voltage command to the electric motor.

According to another aspect of the present invention, an estimation device includes circuitry that estimates a mutual inductance between a first coordinate axis and a second coordinate axis of a rotating coordinate system that rotates in synchronization with a magnetic pole position of an electric motor, based on an interference coefficient representing electromagnetic, mutual interference between the first coordinate axis and the second coordinate axis, a first inductance of the electric motor corresponding to the first coordinate axis, and a second inductance of the electric motor corresponding to the second coordinate axis.

According to yet another aspect of the present invention, an estimation method includes calculating, using circuitry, an interference coefficient representing electromagnetic mutual interference between a first coordinate axis and a second coordinate axis of a rotating coordinate system rotating in synchronization with a magnetic pole position of an electric motor, based on a current supplied to the electric motor, and estimating, using the circuitry, a mutual inductance between the first coordinate axis and the second coordinate axis based on the interference coefficient, a first inductance of the electric motor corresponding to the first coordinate axis, and a second inductance of the electric motor corresponding to the second coordinate axis.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
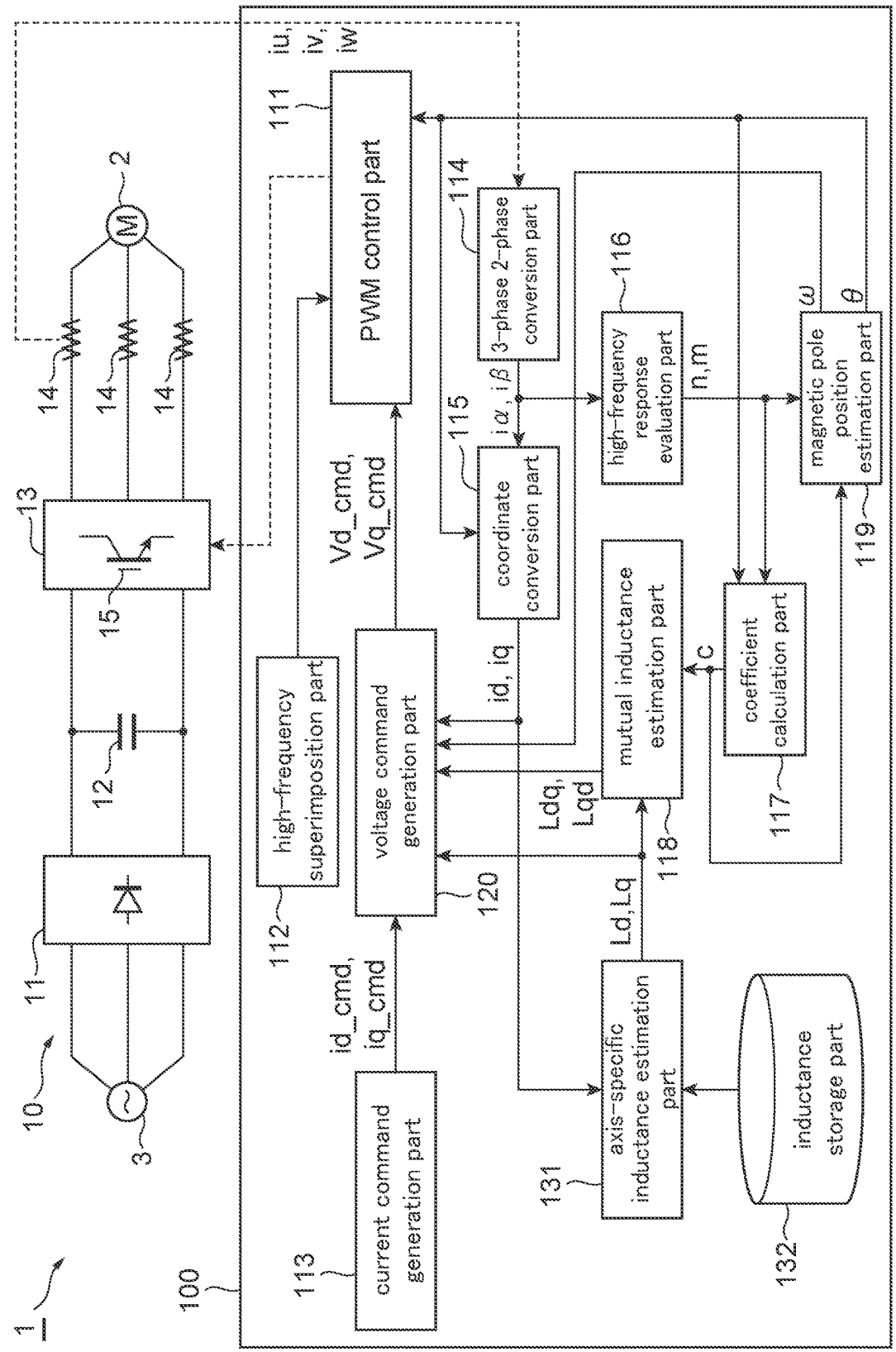
FIG. 1 is a schematic diagram illustrating a structure of a power conversion device according to an embodiment of the present invention.

Embodiments will now be described with reference to the accompanying drawings, wherein like reference numerals designate corresponding or identical elements throughout the various drawings.

Power Conversion Device

A power conversion device 1 illustrated in FIG. 1 is a device that converts primary-side power supplied from a power source 3 into secondary-side power and supplies it to an electric motor 2. The primary-side power and secondary-side power may be AC power or DC power. In the following, a case is described as an example where both the primary-side power and the secondary-side power are three-phase AC power. Specific examples of the power source 3 include a power system of a power company, an uninterruptible power supply, and the like.

The electric motor 2 has saliency. "Having saliency" means that an inductance is different between coordinate axes of a rotating coordinate system. The rotating coordinate system is a coordinate system that rotates in synchronization with a magnetic pole position of the electric motor 2. Specific examples of the electric motor 2 having saliency include an IPM (Interior Permanent Magnet) electric motor, a synchronous reluctance electric motor, and the like. A magnetic pole position of an IPM electric motor is, for example, a position of a magnetic pole of a magnetic field formed by a permanent magnet embedded in an iron core. A magnetic pole position of a synchronous reluctance electric motor is, for example, a position where the inductance is largest.

The power conversion device 1 includes a power conversion circuit 10 and a control circuit 100. The power conversion circuit 10 (power conversion part) converts the primary-side power supplied from the power source 3 into the secondary-side power and supplies it to the electric motor 2. As an example, the power conversion circuit 10 includes a rectifier circuit 11, a smoothing capacitor 12, an inverter circuit 13, and a current sensor 14.

The rectifier circuit 11 is, for example, a diode bridge circuit or a PWM converter circuit, and converts the primary-side power into DC power. The smoothing capacitor 12 smooths the above-described DC power. The inverter circuit 13 performs power conversion between the above-described DC power and the secondary-side power. For example, the inverter circuit 13 converts DC power into the secondary-side power and supplies it to the electric motor 2 in a power running state, and converts the secondary-side power generated by the electric motor 2 into DC power in a regeneration state. For example, the inverter circuit 13 has multiple switching elements 15, and performs the above-described power conversion by switching the multiple switching elements 15 on or off. The switching elements 15 are each, for example, a power MOSFET (Metal Oxide Semiconductor Field Effect Transistor) or an IGBT (Insulated Gate Bipolar Transistor) or the like, and each switch on or off according to a gate drive signal.

The current sensor 14 detects a current flowing between the inverter circuit 13 and the electric motor 2 (hereinafter this current is referred to as a "secondary-side current"). For example, the current sensor 14 may be structured to detect currents of all phases (U-phase, V-phase and W-phase) of the secondary-side power, or may be structured to detect currents of any two phases of the secondary-side power. Unless a zero-phase current is generated, a sum of U-phase, V-phase and W-phase currents is zero, and thus, even when currents of two phases are detected, information about currents of all phases is obtained.

The structure of the power conversion circuit 10 described above is merely an example. The structure of the power conversion circuit 10 can be modified in any way as long as the primary-side power can be converted into the secondary-side power and supplied to the electric motor 2. For example, the rectifier circuit 11 may be a PWM converter circuit that converts AC power into DC power. The power conversion circuit 10 may be a matrix converter circuit that performs bidirectional power conversion between power-source power and drive power without undergoing DC electrification. When the power-source power is DC power, the power conversion circuit 10 may not need to have the rectifier circuit 11.

The control circuit 100 controls the power conversion circuit 10 to generate a voltage command for flowing a secondary-side current corresponding to a current command between the inverter circuit 13 and the electric motor 2 and apply a secondary-side voltage corresponding to the voltage command to the electric motor 2.

In generating a voltage command, a parameter representing a characteristic of the electric motor is required. When a characteristic of the electric motor represented by a parameter deviates from an actual characteristic, followability of a secondary-side current with respect to a current command decreases. When followability of a secondary-side current with respect to a current command decreases, there is a possibility that a secondary-side current cannot be generated at an appropriate timing and ripple in operation of the electric motor 2 increases. Therefore, in order to reduce ripple, it is desirable to use a parameter that more accurately represents a characteristic of the electric motor.

Therefore, the control circuit 100 is structured to execute: generating a voltage command in a rotating coordinate system based on a current command in the rotating coordinate system and a mutual inductance between a first coordinate axis and a second coordinate axis of the rotating coordinate system; and controlling the power conversion circuit 10 to apply a secondary-side voltage corresponding to the voltage command to the electric motor 2. Based on the mutual inductance, a voltage command can be generated to compensate for influence of a first coordinate axis component of a secondary-side current on a second coordinate axis component of a secondary-side voltage and influence of a second coordinate axis component of the secondary-side current on a first coordinate axis component of the secondary-side voltage, and variation of the secondary-side current with respect to a current command can be suppressed.

The control circuit 100 may further execute estimating a mutual inductance based on a magnetic pole position of the electric motor 2, a first inductance of the electric motor 2 corresponding to the first coordinate axis, and a second inductance of the electric motor 2 corresponding to the second coordinate axis and may generate a voltage command based on the estimated mutual inductance. The control circuit 100 may further execute estimating a magnetic pole position based on a secondary-side current, and estimate a mutual inductance based on the estimated magnetic pole position. For example, the control circuit 100 repeats, at a predetermined control period, a control cycle including: estimating a magnetic pole position based on a secondary-side current; estimating a mutual inductance based on the estimated magnetic pole position; generating a voltage command based on a current command and the estimated mutual inductance; and controlling the power conversion circuit 10 to apply a secondary-side voltage corresponding to the voltage command to the electric motor 2.

As an example, the control circuit 100 includes, as functional structural elements, a high-frequency superimposition part 112, a current command generation part 113, a 3-phase 2-phase conversion part 114, a coordinate conversion part 115, a high-frequency response evaluation part 116, a coefficient calculation part 117, a mutual inductance estimation part 118, a magnetic pole position estimation part 119, a voltage command generation part 120, and a PWM control part 111.

The high-frequency superimposition part 112 superimposes a high-frequency component for estimating a magnetic pole position on a secondary-side voltage or a secondary-side current in each control cycle. The high-frequency component is a component that has a high frequency to an extent that it does not substantially affect operation of the electric motor 2. For example, the frequency of the high-frequency component is set sufficiently higher than a frequency at which the electric motor 2 can mechanically respond. As an example, the high-frequency superimposition part 112 superimposes a high-frequency component on a secondary-side voltage. For example, the high-frequency superimposition part 112 superimposes a high-frequency component expressed by the following formula on a secondary-side voltage.

Mathematical Formula 1

$$\begin{bmatrix} V_{\alpha h} \\ V_{\beta h} \end{bmatrix} = \begin{cases} [V_{inj},\ 0]^T, & 0 < t \le (T/4) \\ [0,\ V_{inj}]^T, & (T/4) < t \le (T/2) \\ [-V_{inj},\ 0]^T, & (T/2) < t \le (3T/4) \\ [0,\ -V_{inj}]^T, & (3T/4) < t \le T \end{cases} \quad (1)$$

$V_{\alpha h}$: an α-axis component of a high-frequency voltage
$V_{\beta h}$: a β-axis component of a high-frequency voltage
T: a period of a high-frequency voltage
$V_{inj}$: a magnitude of a voltage vector The α-axis and the β-axis are coordinate axes of an αβ coordinate system. The αβ coordinate system is an example of a fixed coordinate system fixed to a stator of the electric motor 2. The α-axis is along a direction in which a u-phase winding of the electric motor 2 generates a magnetic field, and the β-axis is perpendicular to the α-axis and a rotation center of a rotor of the electric motor 2.

Figure 2:
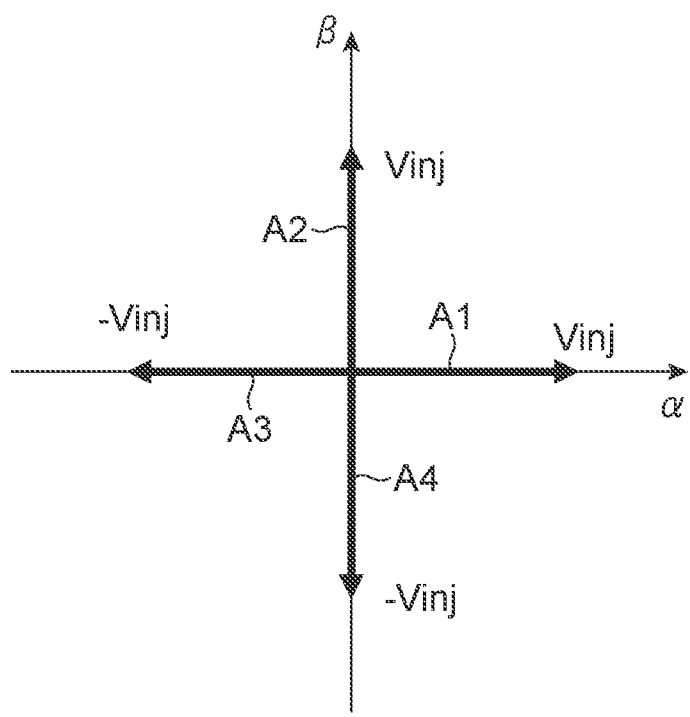
FIG. 2 illustrates a voltage vector to be superimposed.

FIG. 2 illustrates a voltage vector representing a high-frequency voltage superimposed by the high-frequency superimposition part 112 in the αβ coordinate system. As illustrated in FIG. 2, the high-frequency superimposition part 112 repeats adding a voltage represented by a voltage vector (A1) to the secondary-side voltage during a time interval 0<t≤T/4, adding a voltage represented by a voltage vector (A2) to the secondary-side voltage during a time interval T/4<t≤T/2, adding a voltage represented by a voltage vector (A3) to the secondary-side voltage during a time interval T/2<t≤3T/4, and adding a voltage represented by a voltage vector (A4) to the secondary-side voltage during a time interval 3T/4<t≤T.

Returning to FIG. 1, the current command generation part 113 generates, in each control cycle, a current command for causing the electric motor 2 to perform a desired operation. For example, the current command generation part 113 generates a current command for causing an operating speed (for example, a rotation speed) of the electric motor 2 to follow a speed command (for example, a frequency command). For example, the current command generation part 113 generates a current command by performing proportional calculation, proportional/integral calculation, or proportional/integral/differential calculation, or the like on a deviation between a speed command and an operating speed.

The current command generation part 113 generates a current command in a rotating coordinate system. For example, the current command generation part 113 generates a current command in a dq coordinate system, which is an example of a rotating coordinate system. The dq coordinate system has a d-axis and a q-axis as coordinate axes. The d-axis is along a magnetic pole direction of the electric motor 2, and the q-axis is perpendicular to the d-axis and the rotation center of the rotor of the electric motor 2. The d-axis and the q-axis are an example of the first coordinate axis and the second coordinate axis described above. The d-axis may be an example of the first coordinate axis, and the q-axis may be an example of the second coordinate axis. Or, the q-axis may be an example of the first coordinate axis, and the d-axis may be an example of the second coordinate axis. The rotating coordinate system is not limited to the dq coordinate system, and thus, the first coordinate axis and the second coordinate axis are not limited to the d-axis and the q-axis.

For example, the current command generation part 113 calculates a d-axis current command ($i_{d\_cmd}$) and a q-axis current command ($i_{q\_cmd}$). The d-axis current command is a d-axis component of a current command vector representing a current command, and the q-axis current command is a q-axis component of the current command vector.

In each control cycle, the 3-phase 2-phase conversion part 114 acquires a u-phase current ($i_u$), a v-phase current ($i_v$), and a w-phase current ($i_w$) detected by the current sensor 14 and subjects these currents to 3-phase 2-phase conversion to calculate an α-axis current ($i_\alpha$) and a β-axis current ($i_\beta$). The α-axis current ($i_\alpha$) is an α-axis component of a current vector representing a current detected by the current sensor 14, and the β-axis current ($i_\beta$) is a β-axis component of the current vector.

In each control cycle, the coordinate conversion part 115 subjects the α-axis current ($i_\alpha$) and the β-axis current ($i_\beta$) to coordinate conversion to calculate a d-axis current ($i_d$) and a q-axis current ($i_q$). The d-axis current ($i_d$) is a d-axis component of the current vector, and the q-axis current ($i_q$) is a q-axis component of the current vector. The coordinate conversion requires information about the magnetic pole position. For example, the coordinate conversion part 115 performs coordinate conversion based on a magnetic pole position estimated by the magnetic pole position estimation part 119 to be described later in a control cycle that is one or more control cycles before the current control cycle (for example, in the preceding control cycle).

In each control cycle, the high-frequency response evaluation part 116 evaluates a response with respect to a high-frequency component superimposed by the current command generation part 113. For example, the high-frequency response evaluation part 116 extracts response components corresponding to a high-frequency component superimposed on a secondary-side voltage from the α-axis current ($i_\alpha$) and the β-axis current ($i_\beta$) and evaluates the results of the extraction. Examples of methods for extracting the response components include band-pass filtering, fast Fourier transform, and the like. As an example, the high-frequency response evaluation part 116 calculates a sine component (n) and a cosine component (m) as evaluation results of the response components from the following formulas.

Mathematical Formula 2

$$n = \frac{d}{dt}I_{\alpha h V\alpha} - \frac{d}{dt}I_{\beta h V\beta} \quad (2)$$

Mathematical Formula 3

$$m = -\frac{d}{dt}I_{\alpha h V\beta} - \frac{d}{dt}I_{\beta h V\alpha} \quad (3)$$

(d/dt)$I_{\alpha h V\alpha}$: a change in an α-axis current when a voltage is superimposed in an α-axis direction, considering a direction of a superimposed voltage vector as positive (d/dt)$I_{\alpha h V\beta}$: a change in an α-axis current when a voltage is superimposed in a β-axis direction, considering a direction of a superimposed voltage vector as positive (d/dt)$I_{\beta h V\alpha}$: a change in a β-axis current when a voltage is superimposed in an α-axis direction, considering a direction of a superimposed voltage vector as positive (d/dt)$I_{\beta h V\beta}$: a change in a β-axis current when a voltage is superimposed in a β-axis direction, considering a direction of a superimposed voltage vector as positive When electromagnetic mutual interference between the d-axis and the q-axis is ignored, the sine component (n) corresponds to a sine value of twice a rotation angle (θ) representing the above-described magnetic pole position (hereafter, twice the rotation angle (θ) is referred to as a "double angle (2θ)"). Further, when the above-described mutual interference is ignored, the cosine component (m) corresponds to a cosine value of the double angle (2θ). The rotation angle (θ) is, for example, a rotation angle of the dq coordinate system with respect to the αβ coordinate system. As described above, the dq coordinate system is an example of a rotating coordinate system that rotates in synchronization with the magnetic pole position of the electric motor 2, and thus, the rotation angle (θ) represents the magnetic pole position. In the following, why the sine component (n) corresponds to the sine value of the double angle (2θ) and the cosine component (m) corresponds to the cosine value of the double angle (2θ) is described.

When the above-described mutual interference is ignored, a voltage equation of a high-frequency component in the αβ coordinate system is as follows.

Mathematical Formula 4

$$\begin{bmatrix} V_{\alpha h} \\ V_{\beta h} \end{bmatrix} = \begin{bmatrix} L + l\cos 2\theta & l\sin 2\theta \\ l\sin 2\theta & L - l\cos 2\theta \end{bmatrix} \frac{d}{dt} \begin{bmatrix} I_{\alpha h} \\ I_{\beta h} \end{bmatrix} \quad (4)$$

$V_{\alpha h}$: a high-frequency component of an α-axis voltage
$V_{\beta h}$: a high-frequency component of a β-axis voltage
$I_{\alpha h}$: a high-frequency component of an α-axis current
$I_{\beta h}$: a high-frequency component of a β-axis current
L and l in above-described Formula 4 are expressed by following Formulas 5 and 6.

Mathematical Formula 5

$$L = \frac{L_d + L_q}{2} \quad (5)$$

Mathematical Formula 6

$$l = \frac{L_d - L_q}{2} \quad (6)$$

$L_d$: a d-axis inductance
$L_q$: a q-axis inductance

The d-axis inductance ($L_d$) is a proportionality constant of d-axis magnetic flux (magnetic flux generated in a d-axis direction by the d-axis current ($i_d$)) to the d-axis current ($i_d$), and the q-axis inductance ($L_q$) is a proportionality constant of q-axis magnetic flux (magnetic flux generated in a q-axis direction by the q-axis current ($i_q$)) to the q-axis current ($i_q$).

Based on above-described Formulas 1 and 4, a tangent of the double angle (2θ) is represented by following Formula 7.

Mathematical Formula 7

$$\tan 2\theta = \frac{\frac{d}{dt}I_{\alpha h V\alpha} - \frac{d}{dt}I_{\beta h V\beta}}{-\frac{d}{dt}I_{\alpha h V\beta} - \frac{d}{dt}I_{\beta h V\alpha}} \quad (7)$$

Since the right-hand side of above-described Formula 2 and the numerator of the right-hand side of Formula 7 are the same, the sine component (n) calculated from above-described Formula 2 corresponds to the sine value of the double angle (2θ). Since the right-hand side of above-described Formula 3 and the denominator of the right-hand side of Formula 7 are the same, the cosine component (m) calculated from above-described Formula 3 corresponds to the cosine value of the double angle (2θ).

The coefficient calculation part 117 calculates, based on a secondary-side current, an interference coefficient representing electromagnetic mutual interference between the first coordinate axis and the second coordinate axis of the rotating coordinate system. The coefficient calculation part 117 may calculate the interference coefficient further based on a magnetic pole position estimated by the magnetic pole position estimation part 119 to be described later in a control cycle that is one or more control cycles before the current control cycle.

First, a specific example of the interference coefficient is described below. When the above-described mutual interference is considered, a voltage equation of a high-frequency component in the αβ coordinate system is as follows.

Mathematical Formula 8

$$\begin{bmatrix} V_{\alpha h} \\ V_{\beta h} \end{bmatrix} = \begin{bmatrix} L + l\cos 2\theta - L_x\sin 2\theta & l\sin 2\theta - l_x + L_x\cos 2\theta \\ l\sin 2\theta + l_x + L_x\cos 2\theta & L - l\cos 2\theta - L_x\sin 2\theta \end{bmatrix} \frac{d}{dt} \begin{bmatrix} I_{\alpha h} \\ I_{\beta h} \end{bmatrix} \quad (8)$$

Mathematical Formula 9

$$L_x = \frac{L_{qd} + L_{dq}}{2} \quad (9)$$

Mathematical Formula 10

$$l_x = \frac{L_{qd} + L_{dq}}{2} \quad (10)$$

Based on above-described Formulas 1 and 8, the tangent of the double angle (2θ) is represented by the following formula.

Mathematical 11

$$\tan 2\theta = \frac{\frac{d}{dt}I_{\alpha h V\alpha} - \frac{d}{dt}I_{\beta h V\beta} - \frac{L_x}{l}\left(-\frac{d}{dt}I_{\alpha h V\beta} - \frac{d}{dt}I_{\beta h V\alpha}\right)}{-\frac{d}{dt}I_{\alpha h V\beta} - \frac{d}{dt}I_{\beta h V\alpha} + \frac{L_x}{l}\left(-\frac{d}{dt}I_{\alpha h V\alpha} - \frac{d}{dt}I_{\beta h V\beta}\right)} = \frac{n - \frac{L_x}{l}m}{m + \frac{L_x}{l}n} \quad (11)$$

According to Formula 9, due to the above-described mutual interference, the sine component (n) multiplied by $L_x/l$ affects the denominator of the tangent, and the cosine component (m) multiplied by $L_x/l$ affects the numerator of the tangent. Therefore, $L_x/l$ is an example of a coefficient that represents the mutual interference. Therefore, as an example, the interference coefficient (c) is defined as follows.

Mathematical Formula 2

$$c = \frac{L_x}{l} \quad (12)$$

Here, when the sine component (n) and the cosine component (m) are expressed in terms of the rotation angle (θ), the following formulas hold:

Mathematical Formula 4

$$n = \frac{d}{dt}I_{\alpha h V\alpha} - \frac{d}{dt}I_{\beta h V\beta} = V_{inj}(l\sin 2\theta + L_x\cos 2\theta) \quad (13)$$

Mathematical Formula 5

$$m = -\frac{d}{dt}I_{\alpha h V\beta} - \frac{d}{dt}I_{\beta h V\alpha} = V_{inj}(l\cos 2\theta - L_x\sin 2\theta) \quad (14)$$

Based on Formulas 12, 13 and 14, the interference coefficient (c) can be expressed by the following formula.

Mathematical Formula 15

$$c = \frac{n \cdot \cos 2\theta - m \cdot \sin 2\theta}{n \cdot \sin 2\theta + m \cdot \cos 2\theta} \quad (15)$$

To derive the interference coefficient (c) based on Formula 15, in addition to the sine component (n) and the cosine component (m) derived by above-described Formulas 2 and 3, the value of the rotation angle (θ) is required. On the other hand, in each control cycle, the coefficient calculation part 117 may calculate the interference coefficient based on the d-axis current ($i_d$) and the q-axis current ($i_q$) calculated by the coordinate conversion part 115 and a magnetic pole position estimated by the magnetic pole position estimation part 119 in a control cycle that is one or more control cycles before the current control cycle. For example, the coefficient calculation part 117 calculates the interference coefficient (c) from the following formula.

Mathematical Formula 16

$$c = \frac{n[k]\cos 2\theta[k-1] - m[k]\sin 2\theta[k-1]}{n[k]\sin 2\theta[k-1] + m[k]\cos 2\theta[k-1]} \quad (16)$$

n[k]: the sine component (n) calculated by the high-frequency response evaluation part 116 in the current control cycle m[k]: the cosine component (m) calculated by the high-frequency response evaluation part 116 in the current control cycle θ[k−1]: the rotation angle (θ) estimated by the magnetic pole position estimation part 119 in the previous control cycle The mutual inductance estimation part 118 estimates the mutual inductance of the electric motor 2 based on the magnetic pole position of the electric motor 2, the first inductance of the electric motor 2 corresponding to the first coordinate axis, and the second inductance of the electric motor 2 corresponding to the second coordinate axis. For example, in each control cycle, the mutual inductance estimation part 118 estimates mutual inductances ($L_{dq}$, $L_{qd}$) based on the above-described rotation angle (θ), the d-axis inductance ($L_d$) corresponding to the d-axis, and the q-axis inductance ($L_q$) corresponding to the q-axis.

A difference between the mutual inductance ($L_{dq}$) and the mutual inductance ($L_{qd}$) is often small. Therefore, assuming the mutual inductance ($L_{dq}$) and the mutual inductance ($L_{qd}$) are equal, a relationship between the mutual inductances ($L_{dq}$, $L_{qd}$) and the d-axis inductance ($L_d$) and q-axis inductance ($L_q$) is expressed by the following formula.

Mathematical Formula 17

$$L_{dq} = L_{qd} \cong c \cdot \frac{L_d - L_q}{2} \quad (17)$$

Therefore, as an example, the mutual inductance estimation part 118 estimates the mutual inductances ($L_{dq}$, $L_{qd}$) based on the interference coefficient (c), the d-axis inductance ($L_d$), and the q-axis inductance ($L_q$). For example, the mutual inductance estimation part 118 calculates estimation values of the mutual inductances ($L_{dq}$, $L_{qd}$) by substituting the values of the d-axis inductance ($L_d$) and the q-axis inductance ($L_q$) and the value of the interference coefficient (c) calculated by the coefficient calculation part 117 into above-described Formula 9.

As described above, since the coefficient calculation part 117 calculates the interference coefficient (c) based on a magnetic pole position estimated by the magnetic pole position estimation part 119 in a control cycle that is one or more control cycles before the current control cycle, estimating the mutual inductances ($L_{dq}$, $L_{qd}$) based on the interference coefficient (c) corresponds to an example of calculating the interference coefficient (c) based on a magnetic pole position estimated by the magnetic pole position estimation part 119 in a control cycle that is one or more control cycles before the current control cycle.

The magnetic pole position estimation part 119 estimates the magnetic pole position based on a secondary-side current. From above-described Formula 14, for the rotation angle (θ) representing the magnetic pole position, the following formula holds:

Mathematical Formula 18

$$\theta \cong \frac{1}{2}\tan^{-1}\left(\frac{n - cm}{cn + m}\right) \quad (18)$$

Therefore, the magnetic pole position estimation part 119 may estimate the magnetic pole position further based on the interference coefficient (c). For example, in each control cycle, the magnetic pole position estimation part 119 calculates the rotation angle (θ) by substituting the values of the sine component (n) and the cosine component (m) calculated by the high-frequency response evaluation part 116 and the value of the interference coefficient (c) calculated by the coefficient calculation part 117 into above-described Formula 12.

As described above, since high-frequency response evaluation part 116 calculates the sine component (n) and the cosine component (m) based on the α-axis current ($i_\alpha$) and the β-axis current ($i_\beta$), estimating the magnetic pole position based on the sine component (n) and cosine component (m) corresponds to an example of estimating the magnetic pole position based on a detection result of a secondary-side current.

The interference coefficient (c) may be oscillating due to noise or the like in detection results by the current sensor 14. In such a case, the magnetic pole position estimation part 119 may multiply the interference coefficient (c) by any factor greater than 0 and less than 1 and calculate an angle estimation value (θ) from following Formula 19.

Mathematical Formula 19

$$\theta = \frac{1}{2}\tan^{-1}\left(\frac{n - kcm}{kcn + m}\right) \quad (19)$$

The magnetic pole position estimation part 119 may further calculate an angular frequency (ω) corresponding to a differential value of the rotation angle (θ). The angular frequency (ω) is, for example, an angular speed of the dq coordinate system with respect to the αβ coordinate system, and corresponds to a change speed of the magnetic pole position.

A method for estimating the magnetic pole position is not limited to a method based on the interference coefficient (c). For example, the magnetic pole position estimation part 119 may calculate the rotation angle (θ) based on the mutual inductances ($L_{dq}$, $L_{qd}$) estimated by the mutual inductance estimation part 118. As an example, the magnetic pole position estimation part 119 may provisionally estimate the rotation angle (θ) by ignoring the mutual interference, calculate an estimation error due to the ignoring of the mutual interference from the following formula, and calculate the rotation angle (θ) by correcting the provisional estimation result based on the calculation result of the estimation error.

Mathematical Formula 20

$$\theta^e = \frac{1}{2}\tan^{-1}\left(\frac{2L_{dq}}{L_d - L_q}\right) \qquad (20)$$

$\theta^e$: estimation error due to ignoring the mutual interference

The voltage command generation part 120 generates a voltage command in the rotating coordinate system based on a current command in the rotating coordinate system and the mutual inductance between the first coordinate axis and the second coordinate axis of the rotating coordinate system. For example, in each control cycle, the voltage command generation part 120 generates a d-axis voltage command ($V_{d\_cmd}$) and a q-axis voltage command ($V_{q\_cmd}$) in the dq-coordinate system based on the d-axis current command ($i_{d\_cmd}$) and the q-axis current command ($i_{q\_cmd}$) generated by the current command generation part 113, the d-axis current ($i_d$) and the q-axis current ($i_q$) calculated by the coordinate conversion part 115, the d-axis inductance ($L_d$), the q-axis inductance ($L_q$), winding resistance (R) of the electric motor 2, the angular frequency ($\omega$) of the electric motor 2, the mutual inductances ($L_{dq}$, $L_{qd}$) estimated by the mutual inductance estimation part 118, and magnetic flux ($\Phi$). The d-axis voltage command ($V_{d\_cmd}$) is a d-axis component of a voltage command vector representing a voltage command, and the q-axis voltage command ($V_{q\_cmd}$) is a q-axis component of the voltage command vector. The angular frequency ($\omega$) corresponds to an angular speed of the dq coordinate system relative to the $\alpha\beta$ coordinate system and is estimated by the magnetic pole position estimation part 119.

Figure 3:
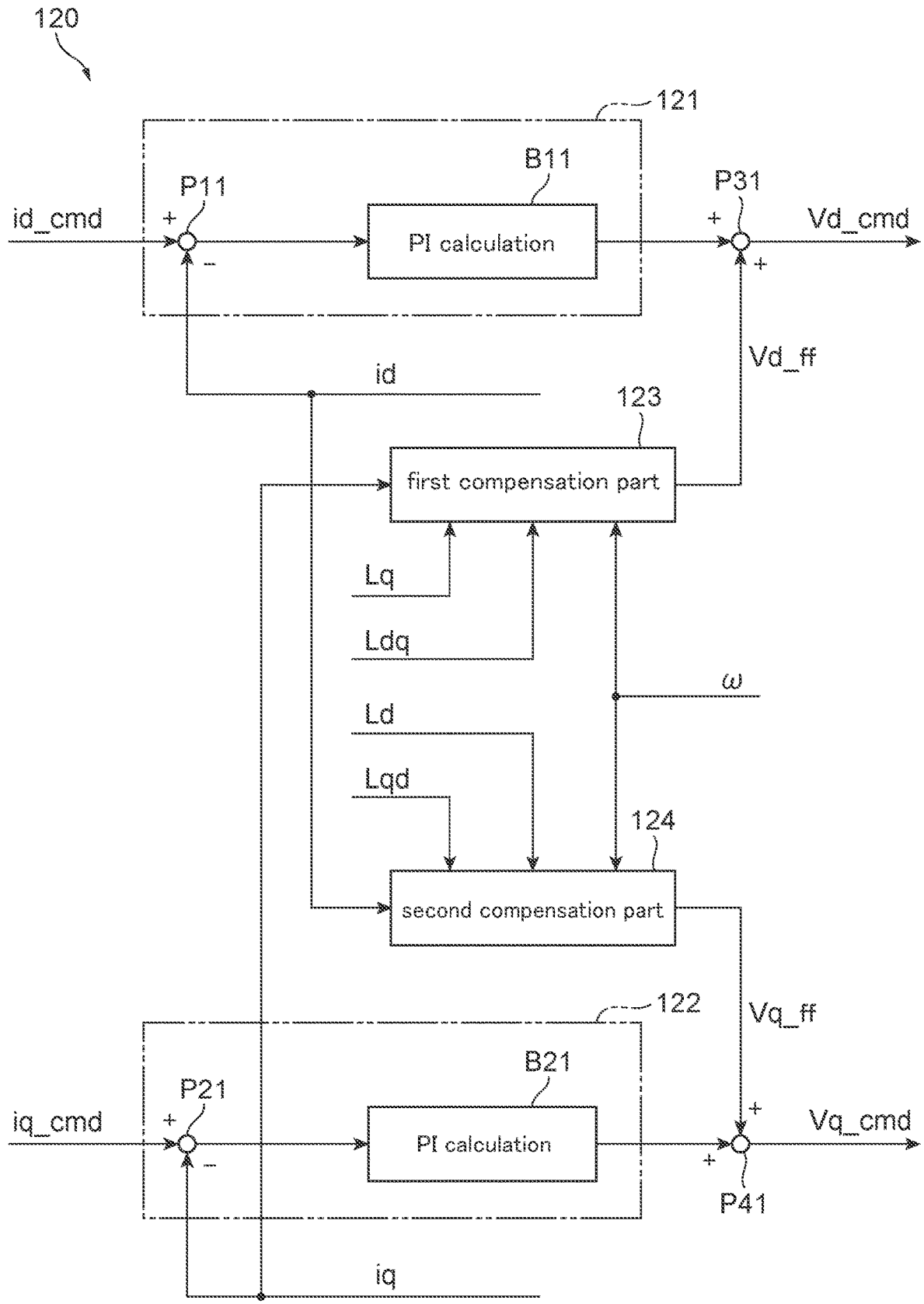
FIG. 3 is a block diagram illustrating a structure of a voltage command generation part according to an embodiment of the present invention.

For example, as illustrated in FIG. 3, the voltage command generation part 120 includes a first command generation part 121, a second command generation part 122, a first compensation part 123, and a second compensation part 124. The first command generation part 121 generates a first coordinate axis component of a voltage command based on a deviation between a first coordinate axis component of a current command and a first coordinate axis component of a secondary-side current. For example, the first command generation part 121 calculates a deviation between the d-axis current command ($i_{d\_cmd}$) and the d-axis current ($i_d$) as represented by a summation point (P11), and calculates the d-axis voltage command ($V_{d\_cmd}$) by performing proportional/integral calculation, proportional calculation, or proportional/integral/differential calculation represented by a block (B11) with respect to the deviation.

The second command generation part 122 generates a second coordinate axis component of a voltage command based on a deviation between a second coordinate axis component of a current command and a second coordinate axis component of a secondary-side current. For example, the second command generation part 122 calculates a deviation between the q-axis current command ($i_{q\_cmd}$) and the q-axis current ($i_q$) as represented by a summation point (P21) and calculates the q-axis voltage command ($V_{q\_cmd}$) by performing proportional/integral calculation, proportional calculation, or proportional/integral/differential calculation represented by a block (B21) with respect to the deviation.

The first compensation part 123 corrects a first coordinate axis component of a voltage command so as to compensate for influence exerted by the mutual inductance on a first coordinate axis component of a secondary-side voltage, based on the mutual inductance and a second coordinate axis component of a secondary-side current. For example, the first compensation part 123 calculates a compensation value ($V_{d\_ff}$) based on the q-axis inductance ($L_q$), the angular frequency ($\omega$) of the electric motor 2, and the mutual inductance ($L_{dq}$) estimated by the mutual inductance estimation part 118, and adds the compensation value ($V_{d\_ff}$) to the d-axis voltage command ($V_{d\_cmd}$) as represented by a summation point (P31). As an example, the first compensation part 123 calculates the compensation value ($V_{d\_ff}$) from the following formula.

Mathematical Formula 21

$$V_{d\_ff} = \frac{d(L_{dq} \cdot i_q)}{dt} - \omega L_q i_q \qquad (21)$$

The second compensation part 124 corrects a second coordinate axis component of a voltage command so as to compensate for influence exerted by the mutual inductance on a second coordinate axis component of a secondary-side voltage, based on the mutual inductance and a first coordinate axis component of a secondary-side current. For example, the second compensation part 124 calculates a compensation value ($V_{q\_ff}$) based on the d-axis inductance ($L_d$), the angular frequency ($\omega$) of the electric motor 2, and the mutual inductance ($L_{qd}$) estimated by the mutual inductance estimation part 118, and adds the compensation value ($V_{q\_ff}$) to the q-axis voltage command ($V_{q\_cmd}$) as represented by a summation point (P41). As an example, the second compensation part 124 calculates the compensation value ($V_{q\_ff}$) from the following formula.

Mathematical Formula 22

$$V_{q\_ff} = \frac{d(L_{qd} \cdot i_d)}{dt} + \omega(L_d i_d + \phi) \qquad (22)$$

The voltage command generation part 120 may calculate a voltage command non-linearly based on a deviation between a first coordinate axis component of a current command and a first coordinate axis component of a secondary-side current, a deviation between a second coordinate axis component of the current command and a second coordinate axis component of the secondary-side current, and the mutual inductance. For example, the voltage command generation part 120 may calculate a voltage command in sliding mode control, which is an example of nonlinear control, from the following formulas.

Mathematical Formula 23

$$\begin{bmatrix} V_{d\_cmd} \\ V_{q\_cmd} \end{bmatrix} = -(K^T \cdot B)^{-1} \cdot K^T \cdot A \cdot e - (K^T \cdot B)^{-1} K_{nl} \cdot \text{sgn}(K^T \cdot e) \qquad (23)$$

Mathematical Formula 24

$$e = \begin{bmatrix} \int (i_{d\_cmd} - i_d) dt \\ i_{d\_cmd} - i_d \\ \int (i_{q\_cmd} - i_q) dt \\ i_{q\_cmd} - i_q \end{bmatrix} \qquad (24)$$

-continued

Mathematical Formula 25

$$A = \begin{bmatrix} 0 & 1 & 0 & 0 \\ 0 & \dfrac{-L_q R}{L_d L_q - L_{qd}^2} & 0 & \dfrac{L_{qd} R}{L_d L_q - L_{qd}^2} \\ 0 & 0 & 0 & 1 \\ 0 & \dfrac{L_{qd} R}{L_d L_q - L_{qd}^2} & 0 & \dfrac{-L_{qd} R}{L_d L_q - L_{qd}^2} \end{bmatrix} \quad (25)$$

Mathematical Formula 26

$$\begin{bmatrix} 0 & 0 \\ \dfrac{L_q}{L_d L_q - L_{qd}^2} & \dfrac{-L_{qd}}{L_d L_q - L_{qd}^2} \\ 0 & 0 \\ \dfrac{-L_{qd}}{L_d L_q - L_{qd}^2} & \dfrac{L_d}{L_d L_q - L_{qd}^2} \end{bmatrix} \quad (26)$$

K: a matrix representing gains with respect to components of a deviation (e) in Formula 24

$K_{nl}$: nonlinear gains

Returning to FIG. 1, in each control cycle, the PWM control part 111 (control part) controls the power conversion circuit 10 to apply a secondary-side voltage corresponding to the voltage command generated by the voltage command generation part 120 to the electric motor 2. For example, the PWM control part 111 converts the d-axis voltage command ($V_{d\_cmd}$) and the q-axis voltage command ($V_{q\_cmd}$) into voltage commands in the αβ coordinate system by coordinate conversion based on the magnetic pole position estimated by the magnetic pole position estimation part 119, and further converts the voltage commands in the αβ coordinate system into voltage commands for u, v and w phases by 2-phase 3-phase conversion. In the following, the voltage commands for the phases are referred to as phase-specific voltage commands.

The above-described current command generation part 113 may superimpose the above-described high-frequency component on a voltage command before the voltage command is converted into a phase-specific voltage command. As a result, a high-frequency component is superimposed on a phase-specific voltage command. The PWM control part 111 switches the switching elements 15 on or off so as to apply a voltage corresponding to a phase-specific voltage command to each of the u phase, the v phase and the w phase using a PWM (Pulse Width Modulation) method.

In the electric motor 2, the first inductance and the second inductance can also change depending on the secondary-side current. Therefore, the control circuit 100 may be structured to estimate current values of the first inductance and the second inductance according to the secondary-side current.

For example, the control circuit 100 may further have an axis-specific inductance estimation part 131. The axis-specific inductance estimation part 131 estimates the first inductance and the second inductance based on the secondary-side current, and the magnetic pole position estimated by the magnetic pole position estimation part 119. For example, in each control cycle, the axis-specific inductance estimation part 131 estimates the d-axis inductance ($L_d$) and the q-axis inductance ($L_q$) based on the d-axis current ($i_d$) and the q-axis current ($i_q$) calculated by the coordinate conversion part 115.

As described above, the d-axis current ($i_d$) and the q-axis current ($i_q$) are calculated based on the detection results by the current sensor 14 and the magnetic pole position estimated by the magnetic pole position estimation part 119. Therefore, estimating the d-axis inductance ($L_d$) and the q-axis inductance ($L_q$) based on the d-axis current ($i_d$) and the q-axis current ($i_q$) corresponds to an example of estimating the d-axis inductance ($L_d$) and the q-axis inductance ($L_q$) based on the secondary-side current and the magnetic pole position estimated by the magnetic pole position estimation part 119.

As an example, the axis-specific inductance estimation part 131 estimates current values of the d-axis inductance ($L_d$) and the q-axis inductance ($L_q$) based on an inductance profile prepared in advance to express a relationship that relates the d-axis current ($i_d$) and the q-axis current ($i_q$) to the d-axis inductance ($L_d$) and the q-axis inductance ($L_q$), and current values of the d-axis current ($i_d$) and the q-axis current ($i_q$). In this case, the control circuit 100 may further include an inductance storage part 132. The inductance storage part 132 stores the inductance profile prepared in advance by actual machine testing or simulation or the like. The axis-specific inductance estimation part 131 may identify the d-axis inductance ($L_d$) and the q-axis inductance ($L_q$) corresponding to the current values of the d-axis current ($i_d$) and the q-axis current ($i_q$) in the inductance profile stored in the inductance storage part 132.

The inductance profile may be a function that continuously expresses the relationship that relates the d-axis current ($i_d$) and the q-axis current ($i_q$) to the d-axis inductance ($L_d$) and the q-axis inductance ($L_q$), or may be point sequence data that discretely expresses the relationship that relates the d-axis current ($i_d$) and the q-axis current ($i_q$) to the d-axis inductance ($L_d$) and the q-axis inductance ($L_q$).

When the inductance storage part 132 stores a discrete inductance profile, the axis-specific inductance estimation part 131 may identify the d-axis inductance ($L_d$) and the q-axis inductance ($L_q$) corresponding to the current values of the d-axis current ($i_d$) and the q-axis current ($i_q$) by interpolating the point sequence of the inductance profile by linear interpolation, polynomial interpolation, spline interpolation, or the like.

When the control circuit 100 includes the axis-specific inductance estimation part 131, the mutual inductance estimation part 118 may estimate the mutual inductance based on the first inductance and the second inductance estimated by the axis-specific inductance estimation part 131.

According to the control circuit 100 illustrated above, a control cycle that includes generating the voltage command by the voltage command generation part 120, calculating the interference coefficient by the coefficient calculation part 117, estimating the magnetic pole position by the magnetic pole position estimation part 119, estimating the mutual inductance by the mutual inductance estimation part 118, and the like is repeated at a control period. The period of the control cycle may be shorter than a variation period of the mutual inductance.

The power conversion device 1 illustrated above includes an estimation device that is structured to execute: calculating, based on a current supplied to the electric motor, an interference coefficient representing electromagnetic mutual interference between the first coordinate axis and the second coordinate axis of the rotating coordinate system that rotates in synchronization with the magnetic pole position of the electric motor; and estimating the mutual inductance between the first coordinate axis and the second coordinate axis based on the interference coefficient, the first inductance of the electric motor 2 corresponding to the first coordinate axis, and the second inductance of the electric motor 2 corresponding to the second coordinate axis.

For example, the power conversion device 1 includes the estimation device having the coefficient calculation part 117 and the mutual inductance estimation part 118. The estimation device repeats an estimation cycle that includes: calculating the interference coefficient by the coefficient calculation part 117: and estimating the mutual inductance by the mutual inductance estimation part, and the coefficient calculation part 117 calculates the interference coefficient further based on the magnetic pole position in an estimation cycle that is one or more estimation cycles before the current estimation cycle.

Further, an example is illustrated where the magnetic pole position is estimated by the magnetic pole position estimation part 119 in a sensorless manner. However, when the magnetic pole position can be detected using a sensor provided in the electric motor 2, the magnetic pole position estimation part 119 can be omitted. In this case, the coordinate conversion part 115 performs the above-described coordinate conversion based on the detection result of the rotation angle ($\theta$), the coefficient calculation part 117 calculates the interference coefficient based on the detection result of the rotation angle ($\theta$), and the PWM control part 111 calculates the voltage command in the $\alpha\beta$ coordinate system based on the detection result of the rotation angle ($\theta$). Further, the voltage command generation part 120 generates a voltage command in the rotating coordinate system based on the detection result of the angular frequency ($\omega$).

Figure 4:
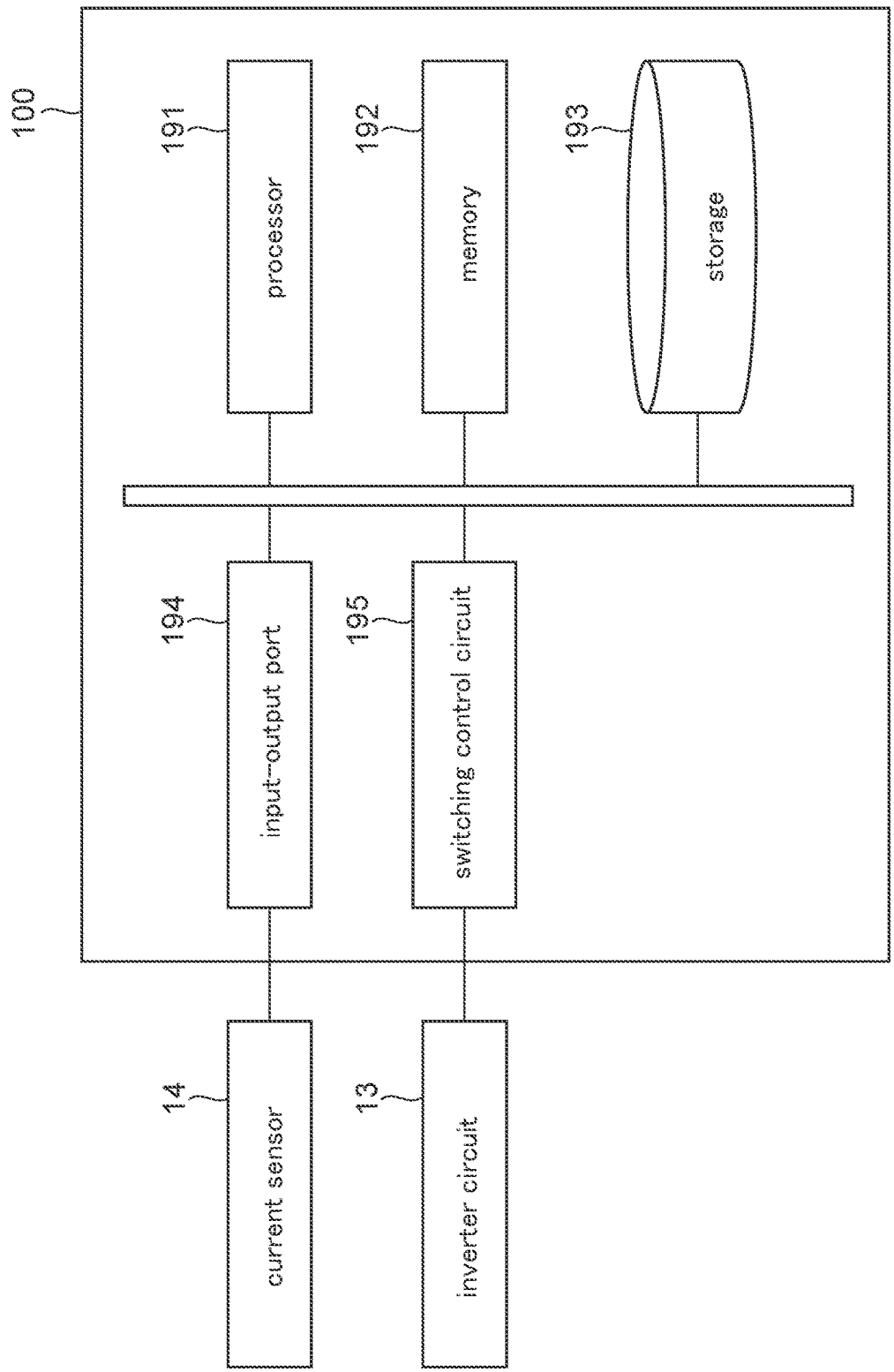
FIG. 4 illustrates a hardware structure of a control circuit according to an embodiment of the present invention.

FIG. 4 is a block diagram illustrating a hardware structure of the control circuit 100. As illustrated in FIG. 4, the control circuit 100 includes at least one processor 191, a memory 192, a storage 193, an input-output port 194, and a switching control circuit 195. The storage 193 has, for example, a computer-readable storage medium, such as a non-volatile semiconductor memory. The storage 193 stores a program for causing the control circuit 100 to execute: generating a voltage command in the rotating coordinate system based on a current command in the rotating coordinate system and the mutual inductance between the first coordinate axis and the second coordinate axis of the rotating coordinate system; and controlling the power conversion circuit 10 to apply a secondary-side voltage corresponding to the voltage command to the electric motor 2. The storage 193 stores a program for causing the above-described functional structural elements to be provided in the control circuit 100.

The memory 192 temporarily stores a program loaded from the storage medium of the storage 193 and a calculation result by the processor 191. The processor 191 forms the functional blocks of the control circuit 100 by executing the above-described program in cooperation with the memory 192. The input-output port 194 performs input or output of an electric signal to or from the current sensor 14 according to a command from the processor 191. The switching control circuit 195 outputs a drive signal for switching the switching elements 15 on or off to the inverter circuit 13 according to a command from the processor 191.

The control circuit 100 is not necessarily limited to achieving the functions by a program. For example, the control circuit 100 may use a dedicated logic circuit or an ASIC (Application Specific Integrated Circuit) that integrates the logic circuit to achieve at least some of the functions.

Power Conversion Procedure

Next, as an example of a control method, a control procedure to be executed by the control circuit 100 is illustrated. This control procedure, as an example of an estimation method of the mutual inductance, includes: calculating the interference coefficient based on a current supplied to the electric motor 2; and estimating the mutual inductance between the first coordinate axis and the second coordinate axis based on the interference coefficient, the first inductance of the electric motor 2 corresponding to the first coordinate axis, and the second inductance of the electric motor 2 corresponding to the second coordinate axis.

Figure 5:
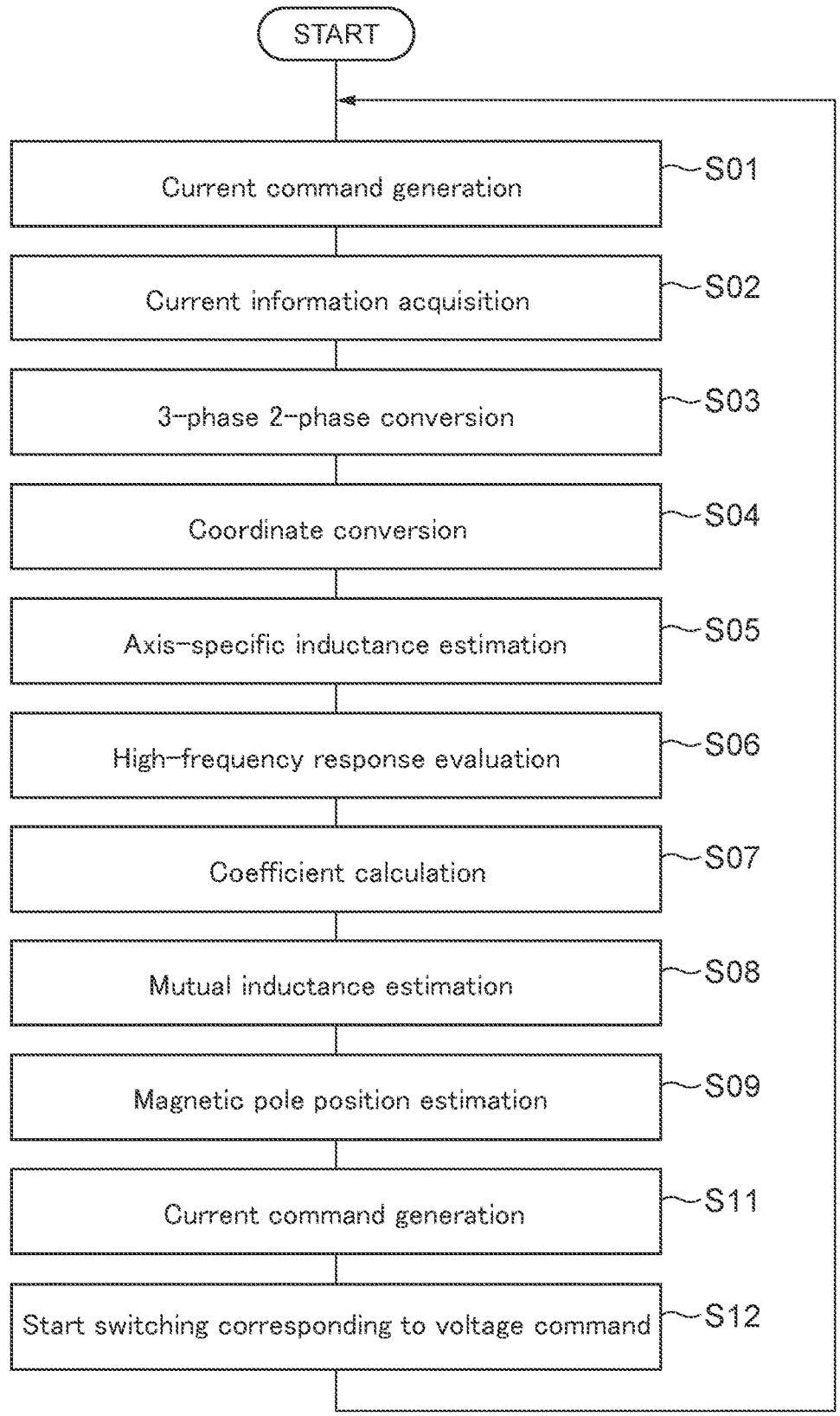
FIG. 5 is a flowchart illustrating a power conversion procedure according to an embodiment of the present invention.

As illustrated in FIG. 5, the control circuit 100 sequentially executes S01, S02, S03, S04, S05, S06, S07, S08, S09, S11, and S12. In S01, the current command generation part 113 generates a d-axis current command ($i_{d\_cmd}$) and a q-axis current command ($i_{q\_cmd}$) for causing the electric motor 2 to perform a desired operation.

In S02, the 3-phase 2-phase conversion part 114 acquires a u-phase current ($i_u$), a v-phase current ($i_v$) and a w-phase current ($i_w$) detected by the current sensor 14. In S03, the 3-phase 2-phase conversion part 114 calculates an $\alpha$-axis current ($i_\alpha$) and a $\beta$-axis current ($i_\beta$) by subjecting the u-phase current ($i_u$), the v-phase current ($i_v$) and the w-phase current ($i_w$) to 3-phase 2-phase conversion. In S04, the coordinate conversion part 115 calculates a d-axis current ($i_d$) and a q-axis current ($i_q$) by subjecting the $\alpha$-axis current ($i_\alpha$) and the $\beta$-axis current ($i_\beta$) to coordinate conversion. In this case, the coordinate conversion part 115 performs the coordinate conversion based on a rotation angle ($\theta$) estimated by the magnetic pole position estimation part 119 in a control cycle that is one or more control cycles before the current control cycle (for example, the previous control cycle).

In S05, the axis-specific inductance estimation part 131 estimates a d-axis inductance ($L_d$) and a q-axis inductance ($L_q$) based on the d-axis current ($i_d$) and the q-axis current ($i_q$) calculated by the coordinate conversion part 115. In S06, the high-frequency response evaluation part 116 evaluates a response with respect to a high-frequency component superimposed by the current command generation part 113. For example, the high-frequency response evaluation part 116 extracts response components corresponding to a high-frequency component superimposed on a secondary-side voltage from the $\alpha$-axis current ($i_\alpha$) and the $\beta$-axis current ($i_\beta$), and calculates the above-described sine component (n) and cosine component (m) based on the results of the extraction.

In S07, the coefficient calculation part 117 calculates the interference coefficient (c) based on the d-axis current ($i_d$) and the q-axis current ($i_q$) calculated by the coordinate conversion part 115 and the rotation angle ($\theta$) estimated by the magnetic pole position estimation part 119 in a control cycle that is one or more control cycles before the current control cycle. For example, the coefficient calculation part 117 calculates the interference coefficient (c) based on the sine component (n) and the cosine component (m) calculated by the high-frequency response evaluation part 116 and the rotation angle ($\theta$) estimated by the magnetic pole position estimation part 119 in the previous control cycle.

In S08, the mutual inductance estimation part 118 estimates the mutual inductances ($L_{dq}$, $L_{qd}$) based on the rotation angle ($\theta$) estimated by the magnetic pole position estimation part 119 in a control cycle that is one or more control cycles before the current control cycle, the d-axis inductance ($L_d$), and the q-axis inductance ($L_q$). For example, the mutual inductance estimation part 118 estimates the mutual inductances ($L_{dq}$, $L_{qd}$) based on the interference coefficient (c) calculated by the coefficient calculation part 117, and the d-axis inductance ($L_d$) and the q-axis inductance ($L_q$) estimated by the axis-specific inductance estimation part 131.

In S09, the magnetic pole position estimation part 119 estimates the rotation angle (θ) and the angular frequency (ω) based on a secondary-side current. For example, the magnetic pole position estimation part 119 calculates the rotation angle (θ) based on the sine component (n) and the cosine component (m) calculated by the high-frequency response evaluation part 116 and the interference coefficient (c) calculated by the coefficient calculation part 117.

In S11, based on the d-axis current command ($i_{d\_cmd}$) and the q-axis current command ($i_{q\_cmd}$) generated by the current command generation part 113, the d-axis current ($i_d$) and the q-axis current ($i_q$) calculated by the coordinate conversion part 115, the d-axis inductance ($L_d$), the q-axis inductance ($L_q$), the winding resistance (R) of the electric motor 2, the angular frequency (ω) of the electric motor 2, and the mutual inductances ($L_{dq}$, $L_{qd}$) estimated by the mutual inductance estimation part 118, the voltage command generation part 120 generates the d-axis voltage command ($V_{d\_cmd}$) and the q-axis voltage command ($V_{q\_cmd}$) in the dq coordinate system.

In S12, the PWM control part 111 starts switching the switching elements 15 of the power conversion circuit 10 on or off such that a voltage corresponding to the voltage command generated by the voltage command generation part 120 is applied to the electric motor 2. The current command generation part 113 superimposes the above-described high-frequency component on the voltage command (the voltage command in the αβ coordinate system) before it is converted into phase-specific voltage commands by the PWM control part 111. As a result, a secondary-side voltage superimposed with the high-frequency component is applied to the electric motor 2.

The control circuit 100 repeats the above-described control cycle at the above-described control period. The estimation result for the rotation angle (θ) in S09 is used in the next cycle in S04 (calculation of the d-axis current ($i_d$) and the q-axis current ($i_q$)) and in S07 (calculation of the interference coefficient (c)).

The above-described procedure can be modified as appropriate. For example, S05 (estimation of the d-axis inductance ($L_d$) and the q-axis inductance ($L_q$)) may be executed after S07 (calculation of the interference coefficient (c)). Further, S09 (estimation of the rotation angle (θ) and the angular frequency (ω)) may be executed before S08 (estimation of the mutual inductances ($L_{dq}$, $L_{qd}$)).

As described above, the power conversion device 1 includes: the power conversion circuit 10 that converts primary-side power to secondary-side power and supplies it to the electric motor 2; the voltage command generation part 120 that generates a voltage command in the rotating coordinate system that rotates in synchronization with the magnetic pole position of the electric motor 2 based on a current command in the rotating coordinate system and the mutual inductance between the first coordinate axis and the second coordinate axis of the rotating coordinate system; and the PWM control part 111 that controls the power conversion circuit 10 to apply a secondary-side voltage corresponding to the voltage command to the electric motor 2.

According to the power conversion device 1, based on the mutual inductance, a voltage command can be generated to compensate for influence of a first coordinate axis component of a secondary-side current on a second coordinate axis component of a secondary-side voltage and influence of a second coordinate axis component of the secondary-side current on a first coordinate axis component of the secondary-side voltage, and followability of a secondary-side current with respect to a current command can be improved. Therefore, it is effective in reducing ripple in operation of the electric motor 2.

The power conversion device 1 may further include the mutual inductance estimation part 118 that estimates the mutual inductance based on the magnetic pole position of the electric motor 2, the first inductance of the electric motor 2 corresponding to the first coordinate axis, and the second inductance of the electric motor 2 corresponding to the second coordinate axis, and the voltage command generation part 120 may generate a voltage command based on the mutual inductance estimated by the mutual inductance estimation part 118. In this case, by estimating the mutual inductance in real time and reflecting the estimation result in the voltage command, it is possible to compensate for influence of time variation of the mutual inductance itself on the secondary-side voltage. Therefore, it is effective to further reduce the ripple in operation of the electric motor 2.

The power conversion device 1 may further include the magnetic pole position estimation part 119 that estimates the magnetic pole position based on a secondary-side current, and the mutual inductance estimation part 118 may estimate the mutual inductance based on the magnetic pole position estimated by the magnetic pole position estimation part 119. In this case, the mutual inductance can be accurately estimated even when sensorless control is performed.

The power conversion device 1 may further include the coefficient calculation part 117 that calculates an interference coefficient representing electromagnetic mutual interference between the first coordinate axis and the second coordinate axis based on a secondary-side current, and the magnetic pole position estimation part 119 may estimate the magnetic pole position further based on the interference coefficient. In this case, by improving estimation accuracy of the magnetic pole position, it is possible to further reduce ripple in operation of the electric motor 2.

The power conversion device 1 repeats a control cycle that includes: generating a voltage command by the voltage command generation part 120; calculating the interference coefficient by the coefficient calculation part 117; estimating the magnetic pole position by the magnetic pole position estimation part 119; and estimating the mutual inductance by the mutual inductance estimation part 118, and the coefficient calculation part 117 may calculate the interference coefficient further based on the magnetic pole position estimated by the magnetic pole position estimation part 119 in a control cycle that is one or more control cycles before the current control cycle. In this case, the interference coefficient can be easily calculated. Simplification of the calculation of the interference coefficient can also contribute to shortening the control cycle period.

The period of the control cycle may be shorter than a variation period of the mutual inductance. In this case, it is possible to further suppress operating ripple caused by variation of the mutual inductance.

The mutual inductance estimation part 118 may estimate the mutual inductance based on the interference coefficient, the first inductance, and the second inductance. In this case, the mutual inductance can be easily calculated by using the interference coefficient also in estimating the mutual inductance.

The power conversion device 1 may further include the axis-specific inductance estimation part 131 that estimates the first inductance and the second inductance based on the secondary-side current and the magnetic pole position estimated by the magnetic pole position estimation part 119, and the mutual inductance estimation part 118 may estimate the mutual inductance based on the first inductance and the second inductance estimated by the axis-specific inductance estimation part 131. In this case, by estimating the first inductance and the second inductance in real time and reflecting the estimation results in the voltage command, it is possible to suppress the operating ripple caused by time variation of the first and second inductances themselves.

The voltage command generation part 120 may include: the first command generation part 121 that generates a first coordinate axis component of a voltage command based on a deviation between a first coordinate axis component of a current command and a first coordinate axis component of a secondary-side current; the second command generation part 122 that generates a second coordinate axis component of a voltage command based on a deviation between a second coordinate axis component of a current command and a second coordinate axis component of a secondary-side current; the first compensation part 123 that corrects a first coordinate axis component of a voltage command so as to compensate for influence exerted by the mutual inductance on a first coordinate axis component of a secondary-side voltage based on the mutual inductance and a second coordinate axis component of a secondary-side current; and the second compensation part 124 that corrects a second coordinate axis component of a voltage command so as to compensate for influence exerted by the mutual inductance on a second coordinate axis component of a secondary-side voltage based on the mutual inductance and a first coordinate axis component of a secondary-side current. In this case, a compensating component for electromagnetic mutual interference between the dq axes can be easily incorporated into a widely used voltage command calculation method.

The voltage command generation part 120 may calculate a voltage command non-linearly based on a deviation between a first coordinate axis component of a current command and a first coordinate axis component of a secondary-side current, a deviation between a second coordinate axis component of the current command and a second coordinate axis component of the secondary-side current, and the mutual inductance. In this case, based on the mutual inductance, a compensating component of the electromagnetic mutual interference between the dq axes can also be easily incorporated into nonlinear voltage command calculation.

Japanese Patent Application Laid-Open Publication No. 2013-90552 describes a rotating electrical machine control device that applies a high-frequency current to a rotating electrical machine with a rotor having saliency, estimates a magnetic pole direction of the rotor based on a high-frequency component included in a voltage command as a response component to the high-frequency current, and performs so-called sensorless vector control for controlling the rotating electrical machine. The rotary electric machine control device calculates an error in an estimated value of the magnetic pole direction caused by magnetic flux interference between dq axes, and performs correction based on the error.

A power conversion device according to an embodiment of the present invention includes: a power conversion circuit that converts primary-side power to secondary-side power and supplies it to an electric motor; a voltage command generation part that generates a voltage command in a rotating coordinate system that rotates in synchronization with a magnetic pole position of the electric motor based on a current command in the rotating coordinate system, and a mutual inductance between a first coordinate axis and a second coordinate axis of the rotating coordinate system; and a control part that controls the power conversion circuit to apply a secondary-side voltage corresponding to the voltage command to the electric motor.

An estimation device according to another embodiment of the present invention includes a mutual inductance estimation part that estimates a mutual inductance between a first coordinate axis and a second coordinate axis of a rotating coordinate system that rotates in synchronization with a magnetic pole position of an electric motor, based on an interference coefficient representing electromagnetic mutual interference between the first coordinate axis and the second coordinate axis, a first inductance of the electric motor corresponding to the first coordinate axis, and a second inductance of the electric motor corresponding to the second coordinate axis.

An estimation method according to yet another embodiment of the present invention includes: calculating an interference coefficient representing electromagnetic mutual interference between a first coordinate axis and a second coordinate axis of a rotating coordinate system rotating in synchronization with a magnetic pole position of an electric motor, based on a current supplied to the electric motor; and estimating a mutual inductance between the first coordinate axis and the second coordinate axis based on the interference coefficient, a first inductance of the electric motor corresponding to the first coordinate axis, and a second inductance of the electric motor corresponding to the second coordinate axis.

A power conversion device according to an embodiment of the present invention is effective in further reducing operating ripple of an electric motor.

Obviously, numerous modifications and variations of the present invention are possible in light of the above teachings. It is therefore to be understood that within the scope of the appended claims, the invention may be practiced otherwise than as specifically described herein.

The invention claimed is:

1. A power conversion device, comprising:
   a power conversion circuit configured to convert primary-side power to secondary-side power and supply the secondary-side power to an electric motor; and
   circuitry comprising a voltage command generator configured to generate a voltage command in a rotating coordinate system that rotates in synchronization with a magnetic pole position of the electric motor, based on a current command in the rotating coordinate system and a mutual inductance between a first coordinate axis and a second coordinate axis of the rotating coordinate system, and a controller configured to control the power conversion circuit to apply a secondary-side voltage corresponding to the voltage command to the electric motor.

2. The power conversion device according to claim 1, wherein the circuitry further includes a mutual inductance estimator configured to estimate the mutual inductance based on the magnetic pole position of the electric motor, a first inductance of the electric motor corresponding to the first coordinate axis, and a second inductance of the electric motor corresponding to the second coordinate axis, and the voltage command generator is configured to generate the voltage command based on the mutual inductance estimated by the mutual inductance estimator.

3. The power conversion device according to claim 2, wherein the circuitry further includes a magnetic pole position estimator configured to estimate the magnetic pole position based on a secondary-side current, and the mutual inductance estimator is configured to estimate the mutual inductance based on the magnetic pole position estimated by the magnetic pole position estimator.

4. The power conversion device according to claim 3, wherein the circuitry further includes a coefficient calculator configured to calculate an interference coefficient representing electromagnetic mutual interference between the first coordinate axis and the second coordinate axis based on a secondary-side current, and the magnetic pole position estimator is configured to estimate the magnetic pole position further based on the interference coefficient.

5. The power conversion device according to claim 4, wherein the circuitry is configured to repeat a control cycle that includes generating the voltage command by the voltage command generator, calculating the interference coefficient by the coefficient calculator, estimating the magnetic pole position by the magnetic pole position estimator, and estimating the mutual inductance by the mutual inductance estimator, and the coefficient calculator is configured to calculate the interference coefficient further based on the magnetic pole position estimated by the magnetic pole position estimator in another control cycle that is one or more control cycles before the control cycle.

6. The power conversion device according to claim 5, wherein a period of the control cycle is shorter than a variation period of the mutual inductance.

7. The power conversion device according to claim 6, wherein the mutual inductance estimator is configured to estimate the mutual inductance based on the interference coefficient, the first inductance, and the second inductance.

8. The power conversion device according to claim 7, wherein the circuitry further includes an axis-specific inductance estimator configured to estimate the first inductance and the second inductance based on a secondary-side current and the magnetic pole position estimated by the magnetic pole position estimator, and the mutual inductance estimator is configured to estimate the mutual inductance based on the first inductance and the second inductance estimated by the axis-specific inductance estimator.

9. The power conversion device according to claim 8, wherein the voltage command generator includes a first command generator configured to generate a component of the voltage command on the first coordinate axis based on a deviation between a component of the current command on the first coordinate axis and a component of a secondary-side current on the first coordinate axis, a second command generator configured to generate a component of the voltage command on the second coordinate axis based on a deviation between a component of the current command on the second coordinate axis and a component of the secondary-side current on the second coordinate axis, a first compensator configured to, based on the mutual inductance and the component of the secondary-side current on the second coordinate axis, correct the component of the voltage command on the first coordinate axis so as to compensate for influence exerted by the mutual inductance on a component of the secondary-side voltage on the first coordinate axis, and a second compensator configured to, based on the mutual inductance and the component of the secondary-side current on the first coordinate axis, correct the component of the voltage command on the second coordinate axis so as to compensate for influence exerted by the mutual inductance on a component of the secondary-side voltage on the second coordinate axis.

10. The power conversion device according to claim 8, wherein the voltage command generator is configured to non-linearly calculate the voltage command based on a deviation between a component of the current command on the first coordinate axis and a component of a secondary-side current on the first coordinate axis, a deviation between a component of the current command on the second coordinate axis and a component of the secondary-side current on the second coordinate axis, and the mutual inductance.

11. An estimation device, comprising:
circuitry configured to estimate a mutual inductance between a first coordinate axis and a second coordinate axis of a rotating coordinate system that rotates in synchronization with a magnetic pole position of an electric motor, based on an interference coefficient representing electromagnetic, mutual interference between the first coordinate axis and the second coordinate axis, a first inductance of the electric motor corresponding to the first coordinate axis, and a second inductance of the electric motor corresponding to the second coordinate axis.

12. The estimation device according to claim 11, wherein the circuitry is configured to calculate the interference coefficient based on a current supplied to the electric motor, the circuitry is configured to repeat an estimation cycle that includes calculating an interference coefficient, and estimating a mutual inductance, and the circuitry is configured to calculate the interference coefficient further based on the magnetic pole position in another estimation cycle that is one or more estimation cycles before the estimation cycle.

13. An estimation method, comprising:
calculating, using circuitry, an interference coefficient representing electromagnetic mutual interference between a first coordinate axis and a second coordinate axis of a rotating coordinate system rotating in synchronization with a magnetic pole position of an electric motor, based on a current supplied to the electric motor; and
estimating, using the circuitry, a mutual inductance between the first coordinate axis and the second coordinate axis based on the interference coefficient, a first inductance of the electric motor corresponding to the first coordinate axis, and a second inductance of the electric motor corresponding to the second coordinate axis.

14. The power conversion device according to claim 4, wherein the mutual inductance estimator is configured to estimate the mutual inductance based on the interference coefficient, the first inductance, and the second inductance.

15. The power conversion device according to claim 5, wherein the mutual inductance estimator is configured to estimate the mutual inductance based on the interference coefficient, the first inductance, and the second inductance.

16. The power conversion device according to claim 3, wherein the circuitry further includes an axis-specific inductance estimator configured to estimate the first inductance and the second inductance based on a secondary-side current and the magnetic pole position estimated by the magnetic pole position estimator, and the mutual inductance estimator is configured to estimate the mutual inductance based on the first inductance and the second inductance estimated by the axis-specific inductance estimator.

17. The power conversion device according to claim 4, wherein the circuitry further includes an axis-specific inductance estimator configured to estimate the first inductance and the second inductance based on a secondary-side current and the magnetic pole position estimated by the magnetic pole position estimator, and the mutual inductance estimator is configured to estimate the mutual inductance based on the first inductance and the second inductance estimated by the axis-specific inductance estimator.

18. The power conversion device according to claim 1, wherein the voltage command generator includes a first command generator configured to generate a component of the voltage command on the first coordinate axis based on a deviation between a component of the current command on the first coordinate axis and a component of a secondary-side current on the first coordinate axis, a second command generator configured to generate a component of the voltage command on the second coordinate axis based on a deviation between a component of the current command on the second coordinate axis and a component of the secondary-side current on the second coordinate axis, a first compensator configured to, based on the mutual inductance and the component of the secondary-side current on the second coordinate axis, correct the component of the voltage command on the first coordinate axis so as to compensate for influence exerted by the mutual inductance on a component of the secondary-side voltage on the first coordinate axis, and a second compensator configured to, based on the mutual inductance and the component of the secondary-side current on the first coordinate axis, correct the component of the voltage command on the second coordinate axis so as to compensate for influence exerted by the mutual inductance on a component of the secondary-side voltage on the second coordinate axis.

19. The power conversion device according to claim 2, wherein the voltage command generator includes a first command generator configured to generate a component of the voltage command on the first coordinate axis based on a deviation between a component of the current command on the first coordinate axis and a component of a secondary-side current on the first coordinate axis, a second command generator configured to generate a component of the voltage command on the second coordinate axis based on a deviation between a component of the current command on the second coordinate axis and a component of the secondary-side current on the second coordinate axis, a first compensator configured to, based on the mutual inductance and the component of the secondary-side current on the second coordinate axis, correct the component of the voltage command on the first coordinate axis so as to compensate for influence exerted by the mutual inductance on a component of the secondary-side voltage on the first coordinate axis, and a second compensator configured to, based on the mutual inductance and the component of the secondary-side current on the first coordinate axis, correct the component of the voltage command on the second coordinate axis so as to compensate for influence exerted by the mutual inductance on a component of the secondary-side voltage on the second coordinate axis.

20. The power conversion device according to claim 1, wherein the voltage command generator is configured to non-linearly calculate the voltage command based on a deviation between a component of the current command on the first coordinate axis and a component of a secondary-side current on the first coordinate axis, a deviation between a component of the current command on the second coordinate axis and a component of the secondary-side current on the second coordinate axis, and the mutual inductance.

* * * * *